(12) United States Patent
Lee et al.

(10) Patent No.: US 7,898,853 B2
(45) Date of Patent: Mar. 1, 2011

(54) MULTI-BIT DATA MEMORY SYSTEM AND READ OPERATION

(75) Inventors: Seung-Jae Lee, Hwaseong-si (KR); Dong-Ku Kang, Yongin-si (KR); Seung-Hwan Song, Suwon-si (KR); Jun-Jin Kong, Yongin-si (KR); Dong-Hyuk Chae, Seoul (KR); Sung-Chung Park, Yuseong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 281 days.

(21) Appl. No.: 12/204,860

(22) Filed: Sep. 5, 2008

(65) Prior Publication Data
US 2009/0067237 A1    Mar. 12, 2009

(30) Foreign Application Priority Data
Sep. 6, 2007   (KR) .................. 10-2007-0090618

(51) Int. Cl.
*G11C 16/04* (2006.01)

(52) U.S. Cl. .......... 365/185.03; 365/185.33; 365/185.17

(58) Field of Classification Search ............. 365/185.03, 365/185.33, 185.17
See application file for complete search history.

(56) References Cited

U.S. PATENT DOCUMENTS

| 5,867,429 | A | 2/1999 | Chen et al. |
| 5,923,587 | A | 7/1999 | Choi |
| 6,075,734 | A | 6/2000 | Jang |
| 6,122,188 | A | 9/2000 | Kim et al. |
| 6,522,580 | B2 | 2/2003 | Chen et al. |
| 7,289,344 | B2 * | 10/2007 | Chen ................................ 365/9 |
| 7,412,575 | B2 * | 8/2008 | Park et al. ...................... 711/159 |
| 2008/0120526 | A1 * | 5/2008 | Eguchi et al. ................. 714/773 |

FOREIGN PATENT DOCUMENTS

| JP | 2003249085 A | 9/2003 |
| KR | 1020070007283 A | 1/2007 |
| KR | 100683858 B1 | 2/2007 |

\* cited by examiner

*Primary Examiner* — Connie C Yoha
(74) *Attorney, Agent, or Firm* — Volentine & Whitt, PLLC

(57) ABSTRACT

Provided is a read operation for a N-bit data non-volatile memory system. The method includes determining in relation to data states of adjacent memory cells associated with a selected memory cell in the plurality of memory cells whether read data obtained from the selected memory cell requires compensation, and if the read data requires compensation, replacing the read data with compensated read data.

19 Claims, 8 Drawing Sheets

Programmed Memory Cell     Memory Cell to be Programmed

→ : F-poly coupling

MULTI-BIT DATA MEMORY SYSTEM AND READ OPERATION

CROSS-REFERENCE TO RELATED APPLICATIONS

This U.S. non-provisional patent application claims priority under 35 U.S.C. §119 to Korean Patent Application No. 10-2007-0090618 filed on Sep. 6, 2007, the subject mater of which is hereby incorporated by reference.

BACKGROUND

The present invention relates to semiconductor memory devices and memory systems. More particularly, the invention relates to a multi-bit data memory system and read method.

Contemporary electronic devices, particularly mobile devices such as MP3 players, PMPs, mobile phones, notebook computers, and PDAs, rely on data storage devices implemented with volatile and/or non-volatile memory devices. Mobile devices require increasingly greater data storage capacities in order to provide various functions, such as video playback, etc. In order to meet the demands for increased data storage capacity, multi-bit memory devices (i.e., memory devices capable of storing at least 2-bit data per constituent memory cell) have replaced single bit memory devices. Exemplary multi-bit memory devices storing multi-bit data are disclosed, for example, in U.S. Pat. Nos. 6,122, 188; 6,075,734; and 5,923,587, the collective subject matter of which is hereby incorporated by reference.

If 1-bit data is stored in a memory cell, said memory cell will exhibit one of two threshold voltage distributions. That is, the memory cell may be placed in one of two states associated with data values of 1 and 0, respectively. On the other hand, if 2-bit data is stored in a memory cell, said memory cell will exhibit one of four threshold voltage distributions. That is, the memory cell may be placed in one of four states associated with data values 11, 10, 00, and 01, respectively. FIG. 1 is a conceptual illustration of threshold voltage distributions corresponding to four data states.

Constituent threshold voltage distributions should be closely controlled to allow each of the threshold voltage distributions to coherently exist within a defined threshold voltage window. One control method successfully employed to accomplish this goal is a programming method commonly referred to as the incremental step pulse programming (ISPP) scheme. According to the ISPP scheme, a programmed threshold voltage may be moved by defined increments with respect to a given threshold voltage distribution using sequence of program loops. Smaller ISPP programming increments generally allow more accurate definition of a threshold voltage distribution. Careful control of respective threshold voltage distributions allows better voltage margin definitions between data states. However, smaller ISPP programming increments also extend the amount of time required to program a memory cell to a desired state, and longer data programming cycles are generally undesirable. Accordingly, the size of ISPP programming increments must be weighed against programming time.

Even if the ISPP scheme is used, a threshold voltage distribution for each data state may expand from its defined threshold voltage distribution window due to a number of factors. For example, as illustrated by the dotted lines 10, 11, 12, and 13 in FIG. 1, each threshold voltage distribution may expand due to, for example, coupling between adjacent memory cells during programming. This coupling is called electric field coupling or F-poly coupling.

Referring to FIG. 2, it is assumed that memory cell MCA has already been programmed into one of four data states, and that memory cell MCB is currently being programmed. Under these assumptions, electrical charge accumulates on the floating gate FG of memory cell MCB as it is programmed. At this occurs, an electric potential between the floating gate FG of adjacent memory cell MCA and the floating gate FG of memory cell MCB correspondingly increases. The resulting increased threshold voltage remains due to coupling between the adjacent floating gates even after programming of the memory cell MCB is complete. Here, the memory cell MCB includes memory cells placed in a word line direction and/or a bit line direction with respect to the memory cell MCA. Due to this coupling, the threshold voltage of the previously programmed memory cell MCA is increased, and as a result, each threshold voltage distribution expands (or broadens) as illustrated by the dotted lines 10, 11, 12, and 13 in FIG. 1. As the threshold voltage distribution for each data state broadens, respective voltage margins between data states are reduced, and read margin is reduced.

One technique for resolving the expansion of threshold voltage distributions due to this coupling phenomenon is disclosed, for example, in U.S. Pat. No. 5,867,429, the subject matter of which is incorporated by reference. Additional background discussion regarding the coupling phenomenon may also be had by reviewing Korean Patent Publication No. 0683858 dated Feb. 9, 2007.

Considering the above description, there are difficulties in obtaining sufficient read margin between data states of multi-bit memory cells since corresponding threshold voltage distributions tend to expand due to electric field coupling/F-poly coupling. As a result, it can become difficult to accurately determine the data state of a programmed memory cell. Conventional remedies to this problem tend to increased the overall size and layout area of memory cell arrays incorporating multi-bit memory cells, and cut against ongoing efforts to further reduce the size of memory systems used in contemporary electronics.

SUMMARY

Embodiments of the invention provide a memory system and read operation capable of improving overall read margin, and memory system reliability.

In one embodiment, the invention provides a read operation for a memory system including a plurality of memory cells each storing multi-bit data, the method comprising; determining in relation to data states of adjacent memory cells associated with a selected memory cell in the plurality of memory cells whether read data obtained from the selected memory cell requires compensation, and if the read data requires compensation, replacing the read data with compensated read data.

In another embodiment, the invention provides a read method for a memory system including a plurality of memory cells each storing multi-bit data, the method comprising; determining whether or not data read obtained from a selected memory cell in the plurality of memory cells is correctable, upon determining that the read data is not correctable, reading data from a plurality of adjacent memory cells potentially affecting a current threshold voltage distribution for the selected memory cell due to electric field coupling/F-poly coupling, in relation to the data read from the plurality of adjacent memory cells, determining whether the read data requires compensation, and if the read data requires compensation, replacing the read data with compensated data.

In another embodiment, the invention provides a memory system comprising; a non-volatile memory device having a plurality of memory cells each storing multi-bit data, and a memory controller controlling the non-volatile memory device, wherein during a read operation, the memory controller is configured to determine in relation to data states of adjacent memory cells associated with a selected memory cell in the plurality of memory cells whether read data obtained from the selected memory cell requires compensation, and upon determining that the read data requires compensation, the memory controller is further configured to replace the read data with compensated read data.

DESCRIPTION OF EMBODIMENTS

Several embodiments of the invention will now be described in some additional detail with reference to the drawings. The invention may, however, be variously embodied and should not be construed as being limited to only the illustrated embodiments. Rather, these embodiments are presented as teaching examples.

A memory system according to an embodiment of the present invention is capable of storing multi-bit (or multi-level) data. In the illustrated embodiments, for convenience of explanation, memory systems will be described that store 2-bit data per memory cell. However, it will be apparent to those skilled in the art that present invention is not limited to only 2-bit data, but covers all N-bit data memory systems, where N is greater than 1.

Figure 1:
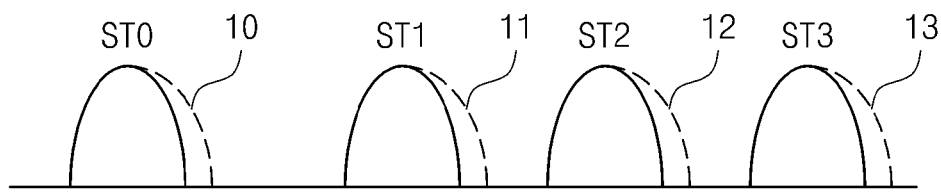
FIG. 1 is a view illustrating the expansions of threshold voltage distributions due to electric field coupling/F-poly coupling.
Figure 2:
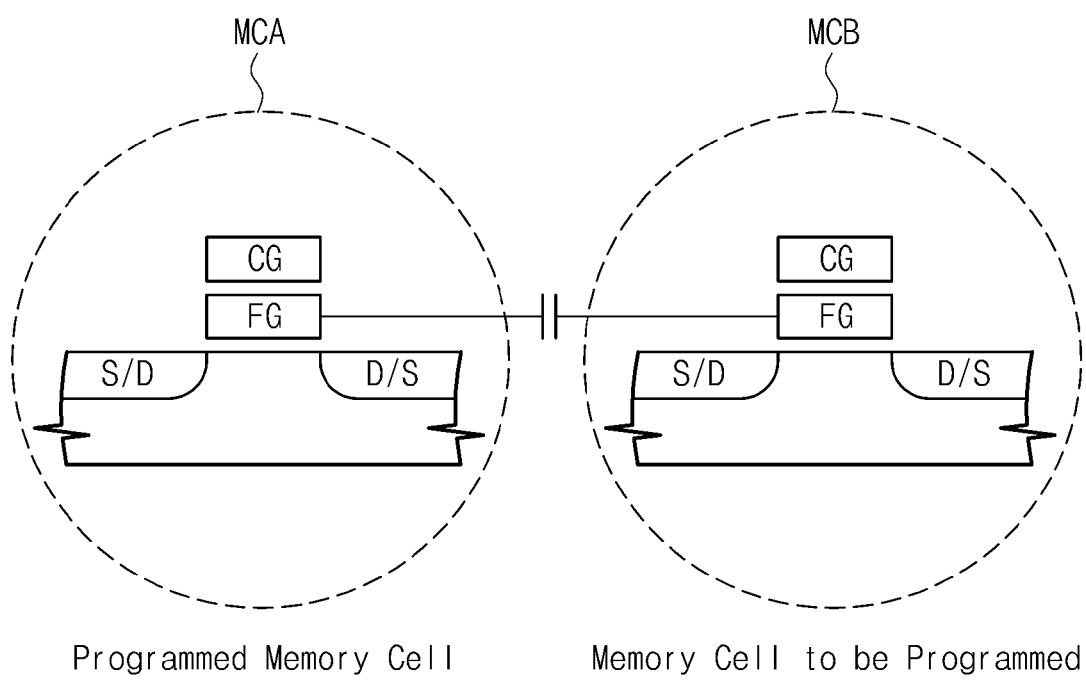
FIG. 2 is a view illustrating electric field coupling/F-poly coupling occurring between memory cells.
Figure 3A:
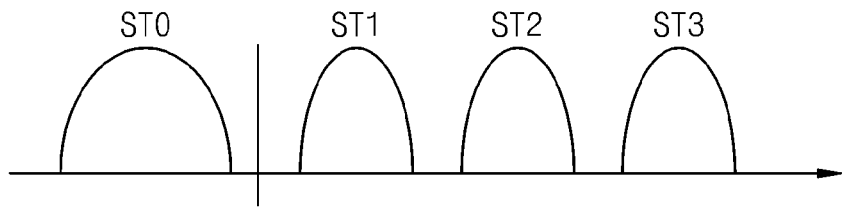
FIGS. 3A through 3C are related views illustrating a reading method for a memory system according to an embodiment to the invention.
Figure 3B:
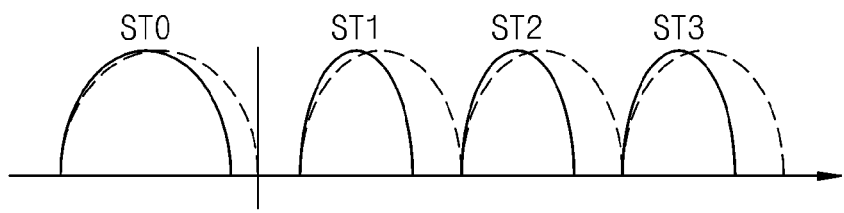

However, since 2-bit data is used in the working examples and as illustrated in FIG. 3A, each memory cell will be programmed to one of four data states ST0, ST1, ST2, and ST3. An ideal (or desired) threshold voltage distribution may be obtained only if each memory cell is not affected by electric field coupling/F-poly coupling. However, as illustrated in FIG. 3B, the threshold voltage (threshold voltage distribution) of each memory cell expands due to electric field coupling/F-poly coupling. See, the dotted lines in FIG. 3B.

Figure 3C:
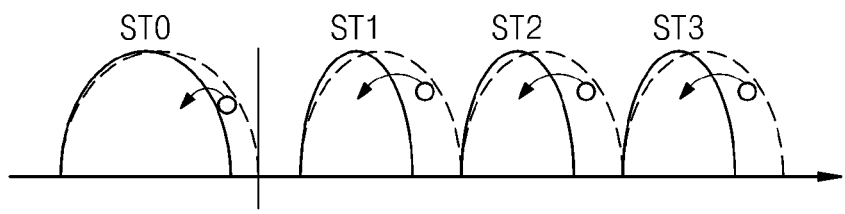

If a threshold voltage of a memory cell is increased due to electric field coupling/F-poly coupling between adjacent memory cells, as mentioned above, probability of read errors increases dues to reduced read margin. To resolve this limitation, when reading data from a selected memory cell as illustrated in FIG. 3C, a memory system according to an embodiment of the invention is configured to read data from each of the adjacent memory cells potentially affecting the selected (i.e., currently being programmed) memory cell through electrical field coupling/F-poly coupling. Then, the memory system compensates for the data read from the selected memory cell in relation to (i.e., based on) the respective data read from the adjacent memory cells. This method aspect will be described in more detail below. Accordingly, even if it is difficult to obtain proper read margin between adjacent data states because corresponding threshold voltage distributions have expanded due to electrical field coupling/F-poly coupling, it is yet possible to accurately determined the programmed state of the selected memory cell.

Figure 4:
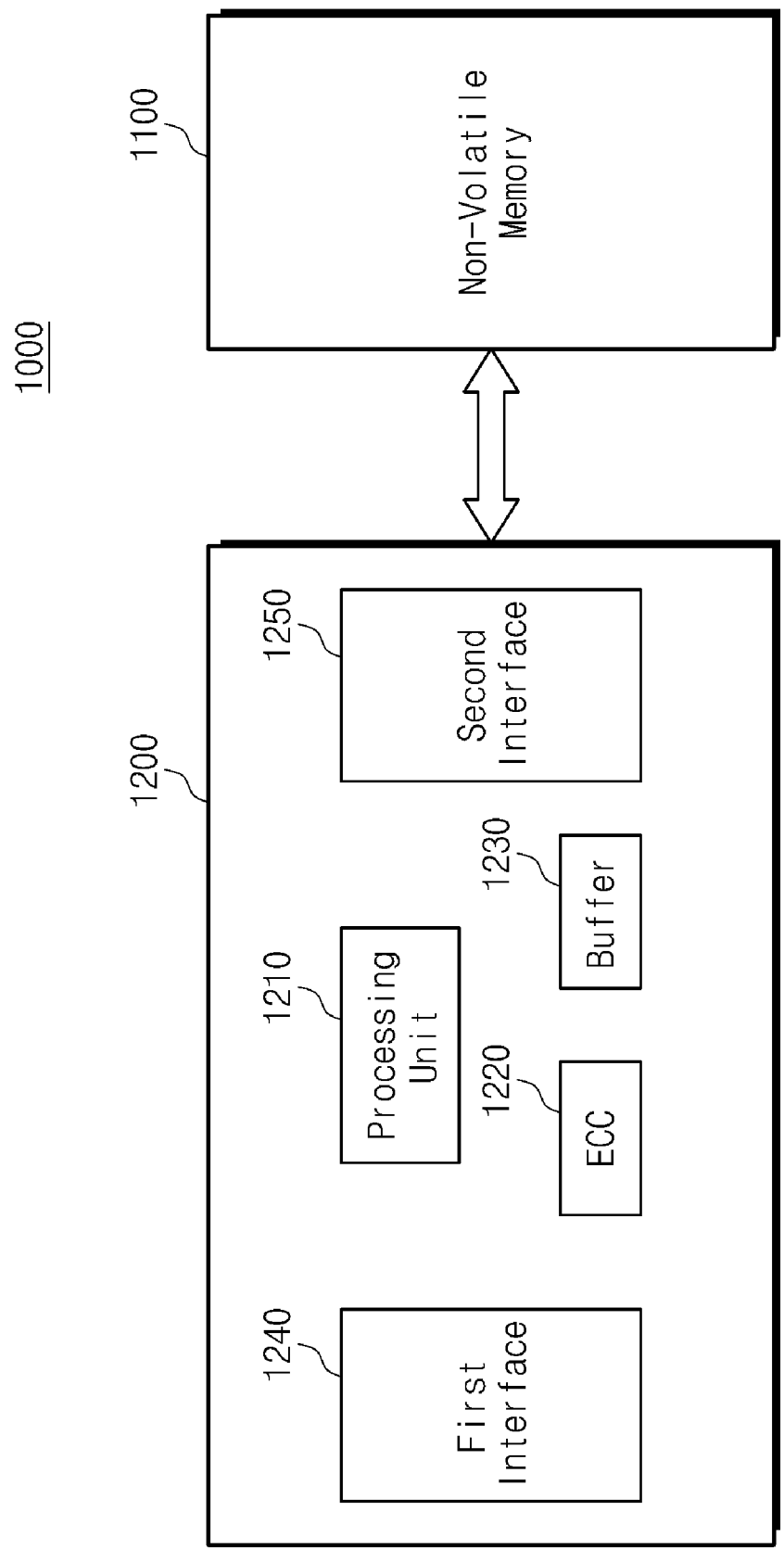
FIG. 4 is a block diagram of a memory system according to an embodiment of the invention.

FIG. 4 is a block diagram of a memory system according to an embodiment of the present invention.

Referring to FIG. 4, a memory system 1000 comprises a non-volatile memory 1100 and a memory controller 1200. Non-volatile memory 1100 includes a plurality of memory cells, each of which stores N-bit data, where N is an integer greater than 1. Non-volatile memory 1100 may be a magnetic random access memory (MRAM), a ferroelectric random access memory (FeRAM), a phase-change random access memory (PRAM), a resistive random access memory (ReRAM), a polymer random access memory (PoRAM), a flash memory, and a charge trap flash (CTF) memory, etc. Memory controller 1200 controls the operation of non-volatile memory 1100 in response to a command (e.g., data requests) received from the external circuit (hereafter, generically referred to as "a host").

In the illustrated embodiment of FIG. 4, memory controller 1200 comprises a processing unit 1210, an error checking and correction (ECC) block 1220, a buffer block 1230, and first and second interface blocks 1240 and 1250. Processing unit 1210 operates in response to a command received from a host provided through first interface block 1240. Processing unit 1210 controls non-volatile memory 1100 through second interface block 1250 in relation to the received command.

Buffer block 1230 is used to temporarily store data associated with a read operation or a program operation directed to non-volatile memory 1100. Thus, buffer block 1230 may be used as a working memory by processing unit 1210.

The ECC block 1240 generates ECC data associated with the write data to be stored in non-volatile memory 1100 during a program operation. ECC block 1240 also performs an error detection and/or correction operation on read data obtained from non-volatile memory 1100 during a read operation. Processing unit 1210, ECC block 1220, buffer block 1230, and first and second interface blocks 1240 and 1250 may be variously implemented using conventionally understood circuitry.

In the illustrated embodiment of FIG. 4, first interface block 1240 may be implemented using, for example, a serial advanced technology attachment (SATA) interface, a parallel AT attachment (PATA) interface, an universal serial BUS (USB) interface, a small computer system interface (SCSI), an enhanced small disk interface (ESDI), and/or an integrated drive electronics (IDE) interface. These particular embodiments of first interface block 1240 are conventionally understood and may be available as off-the-shelf components and related software.

In its operation, memory controller 1200 is able to effectively compensate for read data obtained from a selected memory suffering from some amount of electric field coupling/F-poly coupling. That is, the voltage distribution apparent from the selected (i.e., access-requested) memory cell may be affected by electric field coupling/F-poly coupling due to adjacent memory cells programming operation(s).

This is accomplished, at least in part, by causing the memory controller 1200 to read the data states for memory cells adjacent to the selected memory cell which may exhibit electric field coupling/F-poly coupling with the selected memory cell. The definition of "adjacent memory cells" may vary with memory system design, or may be variably defined by memory system operating conditions. However, the method step of reading of one or more adjacent memory cells data states in order to properly discriminate the data state of a selected memory cell will be referred to as an "F-poly coupling read operation". This will be described in more detail later.

In certain embodiments of the invention, read data from a selected memory cell may be provided to a host either with or without "data compensation" performed in relation to a F-poly coupling read operation. An ability to performed data compensation using an optionally provided F-poly coupling read operation allow the overall read operation (and associated read method) to accurately discriminate the data state for a selected memory cell even when reduced read margin would otherwise make such discrimination very difficult or impossible due to electric field coupling/F-poly coupling.

Figure 5:
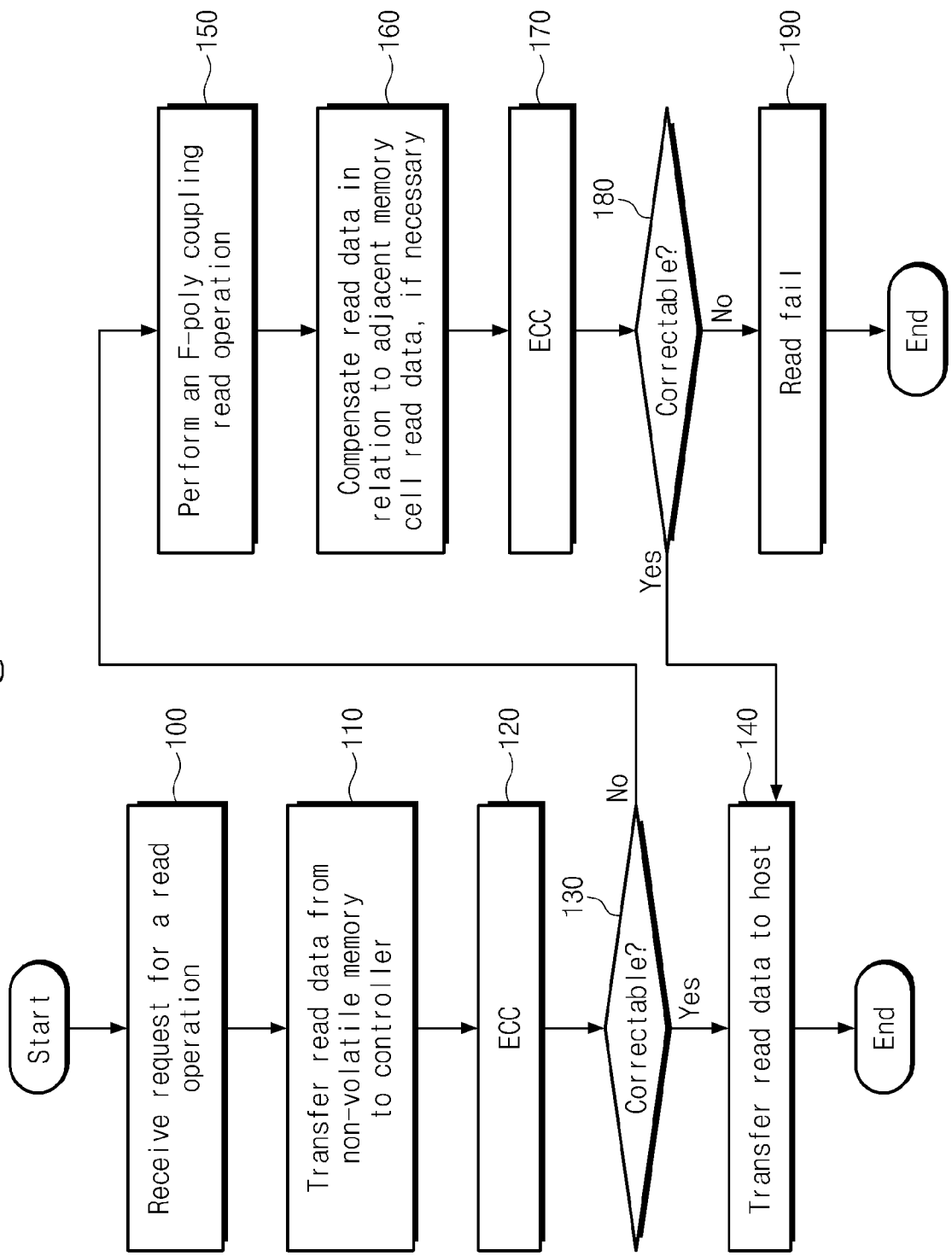
FIG. 5 is a flowchart summarizing a read operation for a memory system according to an embodiment of the invention.

FIG. 5 is a flowchart summarizing a read operation for a memory system according to an embodiment of the invention. The exemplary read operation described in relation to FIG. 5 is made with additional reference to the memory system of FIG. 4 and the conceptual diagram of FIG. 6.

When a command (e.g., a read request) implicating the read operation is received from a host (100), memory controller 1200 controls non-volatile memory 1100 to read data from a selected memory cell identified by the command. Non-volatile memory 1100 then performs the read operation under the control of memory controller 1200 in conventional manner, and transfers the resulting read data from non-volatile memory 1100 to memory controller 1200 (110). The transferred data may be temporarily stored in buffer block 1230 of memory controller 1200.

Figure 6:
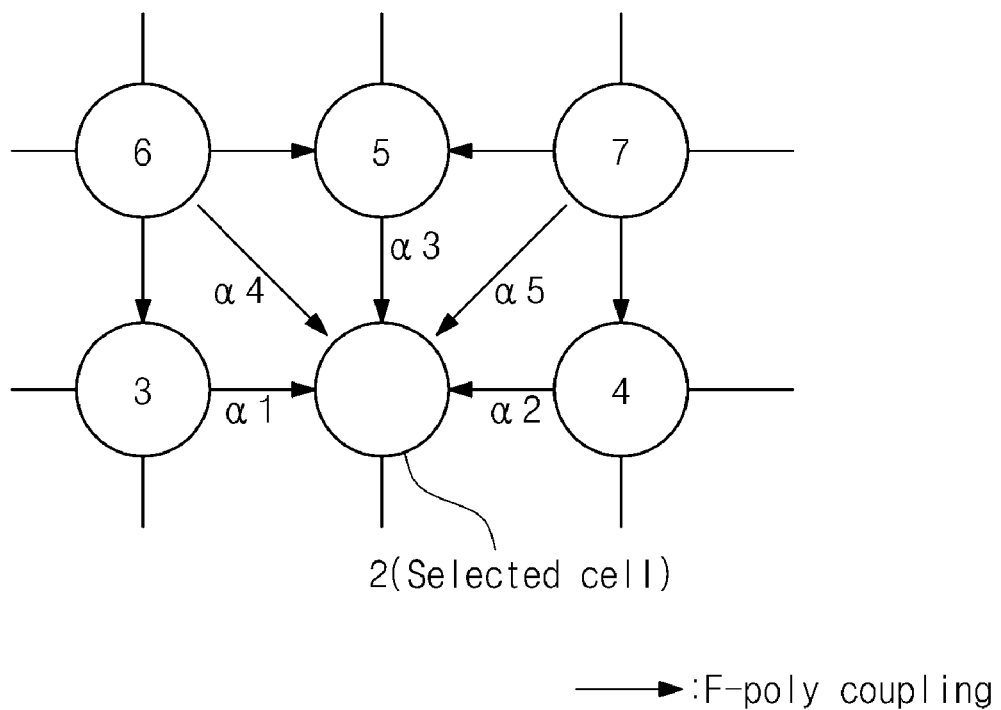
FIGS. 6 and 7 are views conceptually illustrating a read operation for a memory system according to an embodiment of the invention.
Figure 7:
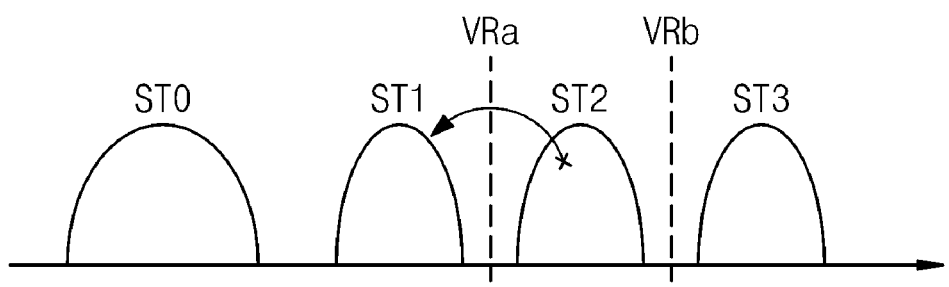

For convenience of explanation and as conceptually illustrated in FIG. 6, memory cell 2 is assumed to be "the selected memory cell" from which N-bit data (2-bit data in the illustrated example) is to be obtained by the current read operation. Memory cells 3 though 7 are defined as "adjacent memory cells" (i.e., memory cells potentially affecting the programmed state of memory cell 2 due to electric field coupling/F-poly coupling.

Following transfer of the read data from non-volatile memory 1100 to memory controller 1200, ECC block 1220 performs an error detection and correction operation with respect to the read data stored in buffer block 1230 (120). One or more conventionally understood ECC operations may be performed by ECC block 1220. The ECC operation will determine whether the read data contains one or more errors, and if so, whether the data error(s) are within the correction capabilities of ECC block 1220 (130). Where no data errors or only correctable data errors are identified in the read data (120=yes), the read data is transferred to the requesting host (140).

However, if the read data contains data errors uncorrectable by the ECC block 1220 (120=no), then the F-poly coupling read operation is performed (150). That is, memory controller 1200 controls non-volatile memory 1100 to perform the F-poly coupling read operation. The F-poly coupling read operation reads data from adjacent memory cells of 3, 4, 5, 6, and 7 (FIG. 6) potentially affecting the threshold voltage distribution of the selected memory cell due to electric field coupling/F-poly coupling.

In one embodiment, the F-poly coupling read operation can be performed by providing a specific read command associated with the F-poly coupling read operation together with address information from memory controller 1200 to non-volatile memory 1100. The respective data states of the adjacent memory cells 3, 4, 5, 6, and 7 read by the F-poly coupling read operation are transferred to memory controller 1200. The resulting "adjacent memory cell read data" may be stored in buffer block 1230 of memory controller 1200. Memory controller 1200 may now use the stored adjacent memory cell read data to modify or compensate the read data obtained from the selected memory cell (160). One exemplary compensation approach will be described in some additional detail hereafter.

Following compensation of the read data (i.e., possible substitution of the initial read data with modified read data), the resulting "compensated read data" is applied to ECC block 1220 to undergo an additional cycle of error detection and correction (170). Where the compensated read data is determined to the correctable, it is transferred to the requesting host (140). Otherwise, if the compensated read data is yet uncorrectable, a read error is indicated (190).

Referring collectively to FIGS. 4 through 8, it is assumed that (initial) read data including data obtained from a selected memory cell having a data state of ST2 includes uncorrectable data errors. Upon consideration of the adjacent memory cell read data during an applied F-poly coupling read operation, it must be determined whether current data state, ST2, of the selected memory cell is due to its programming or due to due threshold voltage distribution expansion that has effectively altered the programmed state of the selected memory cell due to electric field coupling/F-poly coupling.

Figure 8:
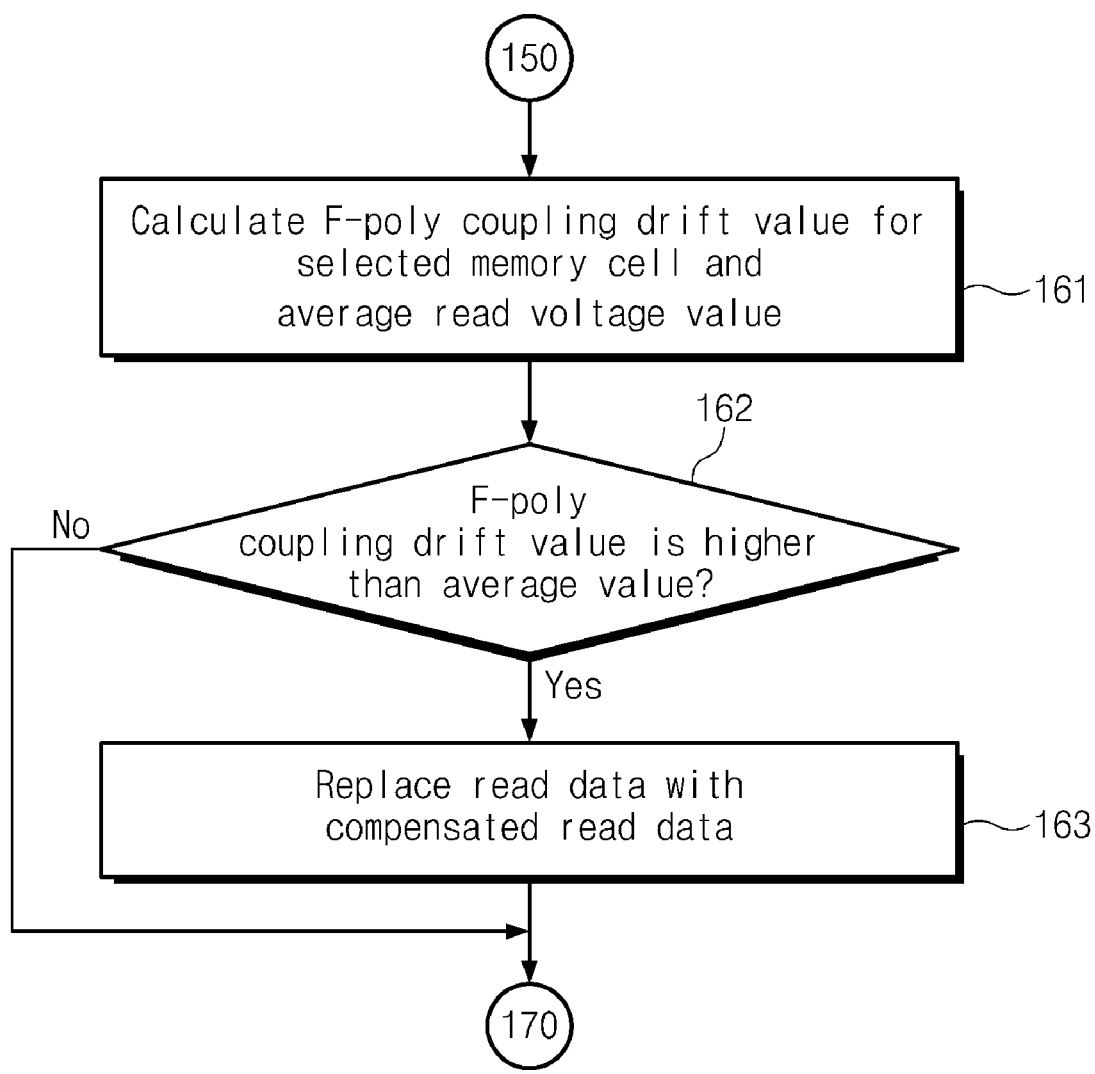
FIG. 8 is a flowchart further summarizing the F-poly coupling read operation of FIG. 5.

For this end and as illustrated in FIG. 8, processing unit 1210 calculates an F-poly coupling drift value (Vdrift) with respect to the selected memory cell 2 (161). The F-poly coupling drift value (Vdrift) may be determined in relation to the respective data states and associated coupling ratios for each one of the adjacent memory cells 3, 4, 5, 6, and 7. That is, the F-poly coupling drift value (Vdrift) with respect to the selected memory cell may be determined by the following relationship:

$$\sum_{m=0}^{i-1} \alpha m \times \Delta Vm,$$

where i is the number of adjacent memory cells, α is a coupling ratio between the selected memory cell and each adjacent memory cell, and ΔV is a voltage variation associated with the programming of each adjacent memory cell into a predetermined state.

For example, the F-poly coupling drift value (Vdrift) may be determined by the product of a first coupling ratio α1 between the selected memory cell 2 and first adjacent memory cell 3 and a voltage variation ΔV associated with the programming of first adjacent memory cell 3 into its current programmed state (e.g., ST0, ST1, ST2 or ST3). Similar products defined in relation to each adjacent memory cell and the selected memory cell may be used in summation to determine the F-poly coupling drift value (Vdrift) (i.e., corresponding second through M coupling ratios and voltage variations for second through Mth adjacent memory cells).

In the illustrated embodiment, the voltage variations ΔV corresponding to respective coupling ratios α1 to α5 and states ST0 to ST3 may be found in a data table stored in buffer block 1230. This table may be loaded from non-volatile memory 1100 to buffer block 1230 during a memory system power-up operation.

Returning to FIG. 8, memory controller 1200 also calculates an average read voltage value ((VRa+VRb)/2) for read voltages (e.g., first and second read voltages, VRa and VRb in FIG. 7) associated with the discrimination of "current data state" (e.g., ST2) of selected memory cell 2. Read voltage information and/or calculated average value(s) may be stored in the above-mentioned table.

Next, processing unit 1210 determines whether the F-poly coupling drift value (Vdrift) is greater than the average read voltage value (162). If the F-poly coupling drift value (Vdrift) is greater than the average read voltage value, the read data obtained from the selected memory cell 2 is "replaced" by corresponding compensated read data having data state ST1 (i.e., a threshold voltage distribution less than the threshold voltage distribution associated with data state ST2 is assumed) (163). In this context, replacement of the read data with compensated data may involve changing the value of the data transferred to the requesting host device and/or re-programming the selected memory cell to obtain a correct threshold voltage distribution corresponding to the compensated read data. Thus, when a calculated F-poly coupling drift value (Vdrift) is determined to be greater than a corresponding average read voltage value, it is statistically likely that the selected memory cell 2 was previously programmed into next lower threshold voltage distribution—in the illustrated example, data state ST1, rather than the current data state ST2 exhibited by the selected memory cell 2. Accordingly, the data read obtained from selected memory cell 2 is replaced with compensated read data.

However, when the calculated F-poly coupling drift value (Vdrift) is less than the average read voltage value, the (initial) read data obtained from selected memory cell 2 is statistically likely to be correct and it is retained without replacement by compensated read data.

In the foregoing embodiment, the relationship between a calculated F-poly coupling drift value (Vdrift) and a corresponding average read voltage value may be used in many different ways to define compensation read data. For example, where the calculated F-poly coupling draft value (Vdrift) is at least twice as great as the corresponding average read voltage value, and single downward shift in threshold voltage distribution may not be adequate. Hence, a double shift (i.e., replacement of ST2 data with ST0 data in the working example) may be called for. Depending of the number, read margins, and overall relationship between data states (and threshold voltage distributions) associated with the M-bit data being stored by a memory system according to an embodiment of the invention, any number of ratios, percentages (up or down), and/or other mathematical relationships between the calculated F-poly coupling draft value (Vdrift) and corresponding average read voltage value may be used to determine appropriate compensated read data.

Figure 9:
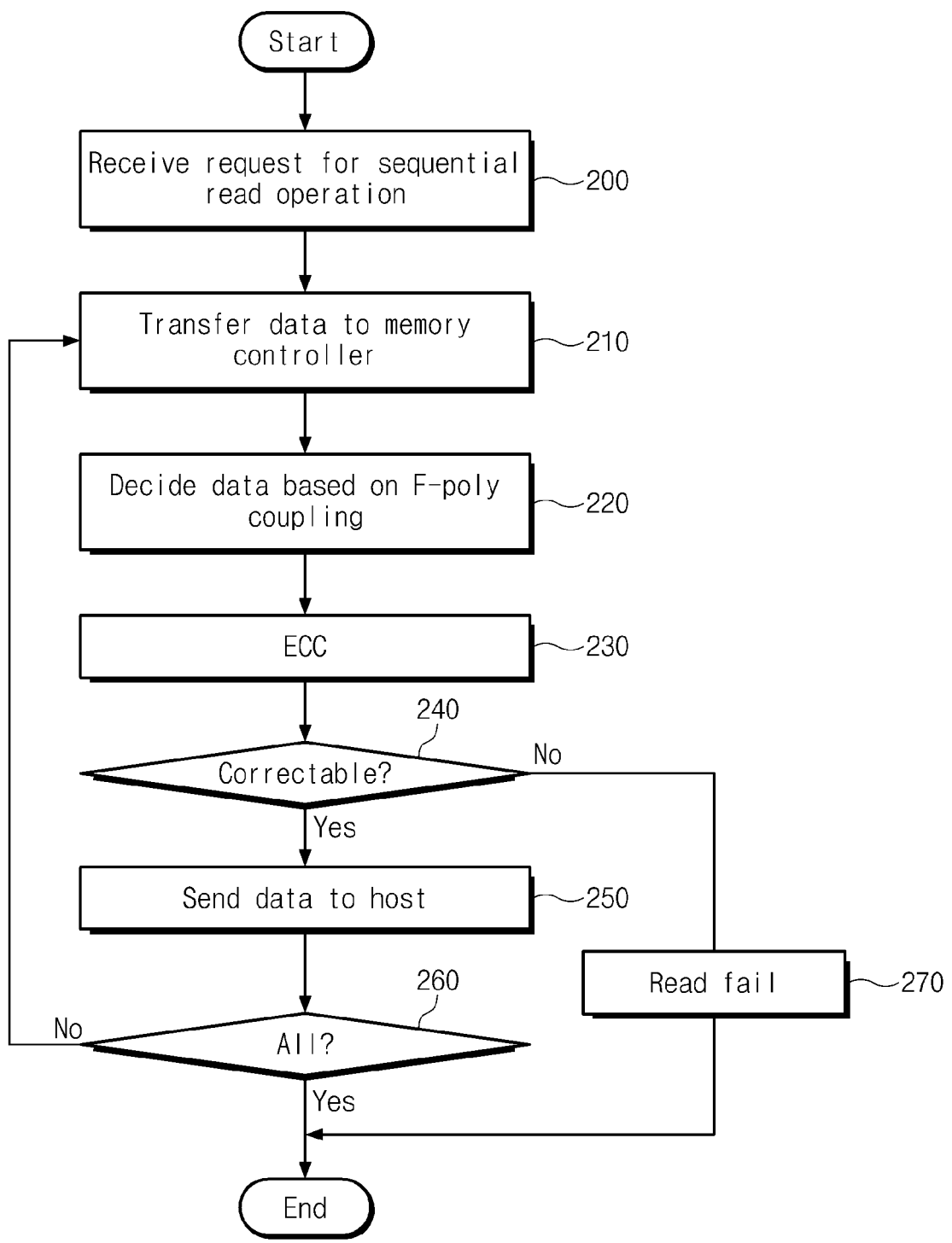
FIG. 9 is a flowchart summarizing a read operation for a memory system according to another embodiment of the invention.

FIG. 9 is a flowchart summarizing a read operation for a memory system according to another embodiment of the invention.

With reference to FIGS. 4 and 9, the read operation begins with a request for a sequential read operation (200). Memory controller 1200 controls non-volatile memory 1100 to execute the sequentially read operation. As a result of the read operation, read data (some or all of the identified sequential read data) is transferred from non-volatile memory 1100 to memory controller 1200 (210). The transmitted read data may be temporarily stored in buffer block 1230 of memory controller 1200. The data state of one or more bits in the read data is compensated using the F-poly coupling read operation (220). This method step may be substantially the same as that described in relation to FIG. 7.

Next, ECC block 1220 performs an error detection and correction operation on the read data stored in buffer block 1230 (230). By operation of ECC block 1220, it is determined whether the read data is correctable or not (240). If the read data is correctable, it is transferred to the requesting host (250). Memory controller 1200 then determines whether all of the requested sequential read data has been transferred to the requesting host device (260). If not, method steps 210 through 250 are repeated until all of the requested sequential read data is transferred.

However, if the data read is determined by ECC block 1220 to be uncorrectable, the sequential read operation fails (270), and memory controller 1200 notifies the requesting host of the sequential read fail.

Flash memory is one form of non-volatile memory capable of retaining stored data when power is interrupted. As mobile devices such as mobile phones, PDAs, digital cameras, portable game consoles, and MP3 players are extensively used, flash memory is also widely used for data and code storage. Furthermore, flash memory may be used in home applications such as HDTV, DVD, a router, and GPS.

Figure 10:
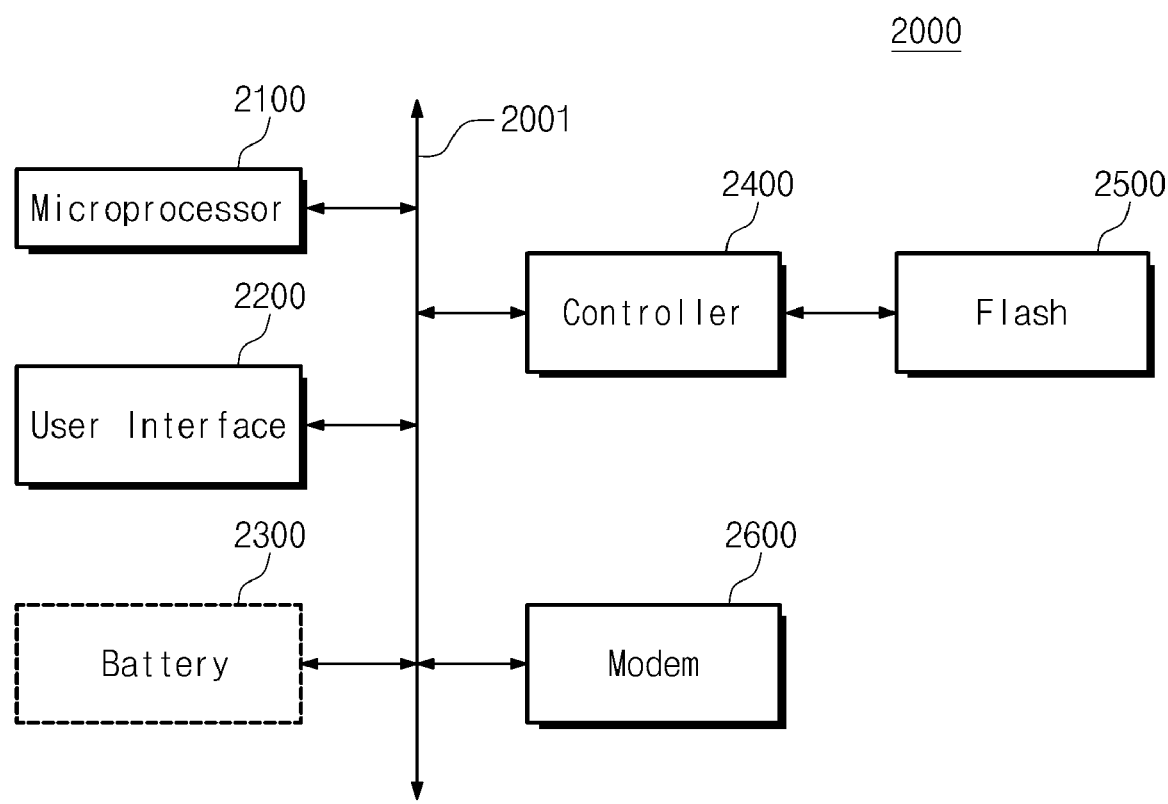
FIG. 10 is a block diagram illustrating a general computational system including a memory system according to an embodiment of the invention.

FIG. 10 is a general block diagram of a computational logic system including the memory system according to an embodiment of the invention. Computing system 2000 includes a microprocessor 2100, a user interface 2200, a modem 2600 such as a baseband chipset, a memory controller 2400, and a flash memory device 2500, all of which are electrically connected through a bus 2001. Memory controller 2400 and flash memory device 2500 constitute the memory system according to an embodiment of the invention, and may be substantially configured like the memory system illustrated in FIG. 4. Memory controller 2400 stores N-bit data which is processed/to be processed by microprocessor 2100, in flash memory device 2500. If computing system 2000 is a mobile device, a battery 2300 may be additionally provided. Although not illustrated in the drawings, it will be apparent to those skilled in the art that computing system 2000 further include an application chipset, a camera image processor (CIS), a mobile DRAM. Furthermore, it is apparent to those skilled in the art that the flash memory and the memory controller may be configured on a memory card.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A read operation for a memory system including a plurality of memory cells each storing multi-bit data, the method comprising:

determining in relation to only state data of adjacent memory cells associated with a selected memory cell in the plurality of memory cells whether read data obtained from the selected memory cell requires compensation; and if the read data requires compensation, replacing the read data with compensated read data.

2. The method of claim 1, wherein the read data requiring compensation has a threshold voltage distribution higher than a threshold voltage distribution associated with the compensated read data.

3. The method of claim 1, further comprising:
performing a read operation in relation to the selected memory cell to obtain the read data;
determining whether or not the read data is correctable; and
upon determining that the read data is not correctable, determining in relation to only the state data of the adjacent memory cells whether the read data requires compensation, and if the read data requires compensation, replacing the read data with compensated read data.

4. The method of claim 3, further comprising:
outputting the read data following correction when the read data is determined to be correctable; and
outputting the compensated read data upon determining that the read data is uncorrectable and requires compensation.

5. A read operation for a memory system including a plurality of memory cells each storing multi-bit data, the method comprising:
determining in relation to data states of adjacent memory cells associated with a selected memory cell in the plurality of memory cells whether read data obtained from the selected memory cell requires compensation; and
if the read data requires compensation, replacing the read data with compensated read data,
wherein determining whether the read data obtained from the selected memory cell requires compensation comprises:
calculating a F-poly coupling drift value with respect to the selected memory cell and a corresponding average read voltage value;
determining whether the F-poly coupling drift value is greater than the average read voltage value; and
if the F-poly coupling draft value is greater than the average read voltage value, determining that the read data obtained from the selected memory cell requires compensation.

6. The method of claim 5, wherein the F-poly coupling drift value is calculated by the equation:

$$\sum_{m=0}^{i-1} \alpha m \times \Delta Vm,$$

where i is a number of the adjacent memory cells, $\alpha$ is a respective coupling ratio between the selected memory cell and each adjacent memory cell, and $\Delta V$ is a respective voltage variation associated with programming of each adjacent memory cell to a predetermined state.

7. A read method for a memory system including a plurality of memory cells each storing multi-bit data, the method comprising:
determining whether or not data read obtained from a selected memory cell in the plurality of memory cells is correctable;
upon determining that the read data is not correctable, reading state data from a plurality of adjacent memory cells potentially affecting a current threshold voltage distribution for the selected memory cell due to electric field coupling/F-poly coupling;
in relation to only the state data read from the plurality of adjacent memory cells, determining whether the read data requires compensation; and
if the read data requires compensation, replacing the read data with compensated data.

8. The method of claim 7, wherein the read data requiring compensation has a threshold voltage distribution higher than a threshold voltage distribution associated with the compensated read data.

9. A read method for a memory system including a plurality of memory cells each storing multi-bit data, the method comprising:
determining whether or not data read obtained from a selected memory cell in the plurality of memory cells is correctable;
upon determining that the read data is not correctable, reading data from a plurality of adjacent memory cells potentially affecting a current threshold voltage distribution for the selected memory cell due to electric field coupling/F-poly coupling;
in relation to the data read from the plurality of adjacent memory cells, determining whether the read data requires compensation; and
if the read data requires compensation, replacing the read data with compensated data,
wherein determining whether the read data requires compensation comprises:
calculating a F-poly coupling drift value with respect to the selected memory cell and a corresponding average read voltage value;
determining whether the F-poly coupling drift value is greater than the average read voltage value; and
if the F-poly coupling draft value is greater than the average read voltage value, determining that the read data obtained from the selected memory cell requires compensation.

10. The method of claim 9, wherein the F-poly coupling drift value is calculated by the equation:

$$\sum_{m=0}^{i-1} \alpha m \times \Delta Vm,$$

where i is a number of adjacent memory cells in the plurality of memory cells, $\alpha$ is a respective coupling ratio between the selected memory cell and each adjacent memory cell, and $\Delta V$ is a respective voltage variation associated with programming of each adjacent memory cell to a predetermined state.

11. A memory system comprising:
a non-volatile memory device having a plurality of memory cells each storing multi-bit data, and a memory controller controlling the non-volatile memory device,
wherein during a read operation, the memory controller is configured to determine in relation to only state data of adjacent memory cells associated with a selected memory cell in the plurality of memory cells whether read data obtained from the selected memory cell requires compensation; and
upon determining that the read data requires compensation, the memory controller is further configured to replace the read data with compensated read data.

12. The system of claim 11, wherein the memory controller in relation to the determination that the read data requires compensation is further configured to perform a read operation and obtain the read data, determine whether or not the read data is correctable, and upon determining that the read data is not correctable, determine in relation to only the state data of the adjacent memory cells whether the read data requires compensation.

13. The system of claim 12, wherein the memory controller is further configured to replace the read data with compensated read data if the read data requires compensation and output the compensated read data.

14. The system of claim 12, wherein the memory controller is further configured to output the read data without compensation when the read data is correctable.

15. A memory system comprising:
a non-volatile memory device having a plurality of memory cells each storing multi-bit data, and a memory controller controlling the non-volatile memory device,
wherein during a read operation, the memory controller is configured to determine in relation to data states of adjacent memory cells associated with a selected memory cell in the plurality of memory cells whether read data obtained from the selected memory cell requires compensation; and
upon determining that the read data requires compensation, the memory controller is further configured to replace the read data with compensated read data,
wherein the memory controller is further configured to calculate a F-poly coupling drift value with respect to the selected memory cell and a corresponding average read voltage value, determine whether the F-poly coupling drift value is greater than the average read voltage value, and if the F-poly coupling draft value is greater than the average read voltage value, determine that the read data requires compensation.

16. The system of claim 15, wherein the memory controller calculates the F-poly coupling drift value using the equation:

$$\sum_{m=0}^{i-1} \alpha m \times \Delta Vm,$$

where i is a number of the adjacent memory cells, α is a respective coupling ratio between the selected memory cell and each adjacent memory cell, and ΔV is a respective voltage variation associated with programming of each adjacent memory cell to a predetermined state.

17. The system of claim 11, wherein the memory controller further comprises:
an error detection and correction (ECC) block receiving the read data and determining whether or not the read data is correctable.

18. The system of claim 17, wherein the non-volatile memory device is one of a magnetic random access memory (MRAM), a ferroelectric random access memory (FeRAM), a phase-change random access memory (PRAM), a resistive random access memory (ReRAM), a polymer random access memory (PoRAM), a flash memory, and a charge trap flash (CTF) memory.

19. The system of claim 18, wherein the memory controller further comprises an interface enabling data transfer between the memory controller and a host device, the interface comprising one of a serial advanced technology attachment (SATA) interface, a parallel AT attachment (PATA) interface, an universal serial BUS (USB) interface, a small computer system interface (SCSI), an enhanced small disk interface (ESDI), and an integrated drive electronics (IDE) interface.

* * * * *